(12) United States Patent  
Kim et al.

(10) Patent No.: US 9,153,778 B2  
(45) Date of Patent: Oct. 6, 2015

(54) RESISTIVE SWITCHING DEVICES AND MEMORY DEVICES INCLUDING THE SAME

(71) Applicant: Samsung Electronics Co., Ltd., Suwon-Si, Gyeonggi-Do (KR)

(72) Inventors: Kyung-min Kim, Goyang-si (KR); Young-bae Kim, Seoul (KR); Chang-jung Kim, Yongin-si (KR); Seung-ryul Lee, Seoul (KR); Man Chang, Seoul (KR); Sung-ho Kim, Yongin-si (KR); Eun-ju Cho, Yecheon-gun (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 232 days.

(21) Appl. No.: 13/867,411

(22) Filed: Apr. 22, 2013

(65) Prior Publication Data

US 2014/0092668 A1 Apr. 3, 2014

(30) Foreign Application Priority Data

Sep. 28, 2012 (KR) .................. 10-2012-0109264

(51) Int. Cl.
*G11C 11/00* (2006.01)
*H01L 45/00* (2006.01)
*G11C 13/00* (2006.01)
*H01L 27/24* (2006.01)

(52) U.S. Cl.
CPC .......... *H01L 45/146* (2013.01); *G11C 13/0007* (2013.01); *G11C 13/0069* (2013.01); *H01L 45/08* (2013.01); *H01L 45/1233* (2013.01); *G11C 2213/32* (2013.01); *G11C 2213/51* (2013.01); *G11C 2213/55* (2013.01); *H01L 27/2463* (2013.01)

(58) Field of Classification Search
CPC ... H01L 45/146; H01L 45/08; H01L 45/1233; H01L 27/2463; G11C 13/0069; G11C 13/0007; G11C 2213/32; G11C 2213/55; G11C 2213/51
USPC .......... 365/148, 163, 158, 171, 173; 257/4, 5, 257/154, 537, 489
See application file for complete search history.

(56) References Cited

U.S. PATENT DOCUMENTS

| | | | |
|---|---|---|---|
| 6,563,185 B2 * | 5/2003 | Moddel et al. | 257/425 |
| 8,107,272 B2 | 1/2012 | Sato | |
| 2008/0247215 A1 | 10/2008 | Ufert | |
| 2009/0225582 A1 * | 9/2009 | Schloss | 365/148 |

FOREIGN PATENT DOCUMENTS

| KR | 20090098443 A | 9/2009 |
|---|---|---|
| KR | 20100084333 A | 7/2010 |

* cited by examiner

*Primary Examiner* — Thao H Bui
(74) *Attorney, Agent, or Firm* — Harness, Dickey & Pierce

(57) ABSTRACT

A resistive switching device includes a first material layer between a first electrode and a second electrode. The first material layer has a first region and a second region parallel to the first region. The first region corresponds to a conducting path formed in the first material layer, and is configured to switch from a low-resistance state to a high-resistance state in response to an applied voltage that is greater than or equal to a first voltage. The second region is configured to switch to a first resistance value that is less than a resistance value of the first region in the high-resistance state when the applied voltage is greater than or equal to a second voltage. The first region remains constant or substantially constant when the second region has the first resistance value.

20 Claims, 4 Drawing Sheets

RESISTIVE SWITCHING DEVICES AND MEMORY DEVICES INCLUDING THE SAME

CROSS-REFERENCE TO RELATED APPLICATIONS

This application claims priority under 35 U.S.C. §119 to Korean Patent Application No. 10-2012-0109264, filed on Sep. 28, 2012, in the Korean Intellectual Property Office, the disclosures of which are incorporated herein in their entirety by reference.

BACKGROUND

1. Field

Example embodiments relate to resistive switching devices and/or memory devices including the same.

2. Description of the Related Art

Examples of non-volatile memory include a resistance random access memory (RRAM), a magnetic random access memory (MRAM), a ferroelectric random access memory (FRAM), and a phase-change random access memory (PRAM). RRAMs include a resistive switching device and write data by using the resistance switching characteristics of the resistive switching device.

Resistive switching devices switch to one of two different resistance states and retain the resistance state until subsequent switching occurs without electrical power. During repeated resistance switching of the resistive switching devices, a RRAM writes and deletes data.

In order to provide stable operation of a RRAM, guarantee of reproducibility and durability against repeated resistance switching is required. To achieve this, it is necessary for a resistive switching device to maintain uniform resistance for each of two resistance states.

SUMMARY

One or more example embodiments provide resistive switching devices and memory devices including the same. Additional aspects will be set forth in part in the description which follows and, in part, will be apparent from the description, or may be learned by practice of the example embodiments set forth herein.

According to at least one example embodiment, a resistive switching device includes: a first material layer between a first electrode and a second electrode. The first material layer a first region and a second region in parallel with the first region. The first region corresponds to a conducting path formed in the first material layer, the first region is configured to switch from a low-resistance state to a high-resistance state in response to an applied voltage that is greater than or equal to a first voltage, the second region is configured to switch to a first resistance value that is less than a resistance value of the first region in the high-resistance state when the applied voltage is greater than or equal to a second voltage, and the resistance value of the first region remains constant or substantially constant by switching to the first resistance value of the second region.

At least one other example embodiment provides a resistive switching device including: a resistive switching element configured to switch between a low-resistance state and a high-resistance state in response to an applied voltage that is greater than or equal to a first voltage; and a switch element connected in parallel with the resistive switching element, the switch element being configured to switch from a second resistance value to a first resistance value when the applied voltage is greater than or equal to a second voltage, the first resistance value being less than a resistance value of the resistive switching element in the high-resistance state. The resistance value of the resistive switching element remains constant or substantially constant by switching to the first resistance value of the second region.

At least one other example embodiment provides a memory cell including one or more of the resistive switching devices discussed herein configured to at least one of write and delete data to and from the memory cell by switching between the high-resistance state and the low-resistance state.

At least one other example embodiment provides a memory device including: at least one first wiring; at least one second wiring crossing the at least one first wiring; and at least one memory cell at a cross point between the first and second wirings. The memory cell includes: a first material layer between a first electrode and a second electrode, the first material layer including a first region and a second region in parallel with the first region. The first region corresponds to a conducting path formed in the first material layer, the first region is configured to switch from a low-resistance state to a high-resistance state in response to an applied voltage that is greater than or equal to a first voltage, the second region is configured to switch to a first resistance value that is less than a resistance value of the first region in the high-resistance state when the applied voltage is greater than or equal to a second voltage, and the resistance value of the first region remains constant or substantially constant by switching to the first resistance value of the second region.

BRIEF DESCRIPTION OF THE DRAWINGS

These and/or other aspects will become apparent and more readily appreciated from the following description of example embodiments, taken in conjunction with the accompanying drawings of which.

DETAILED DESCRIPTION

Figure 1:
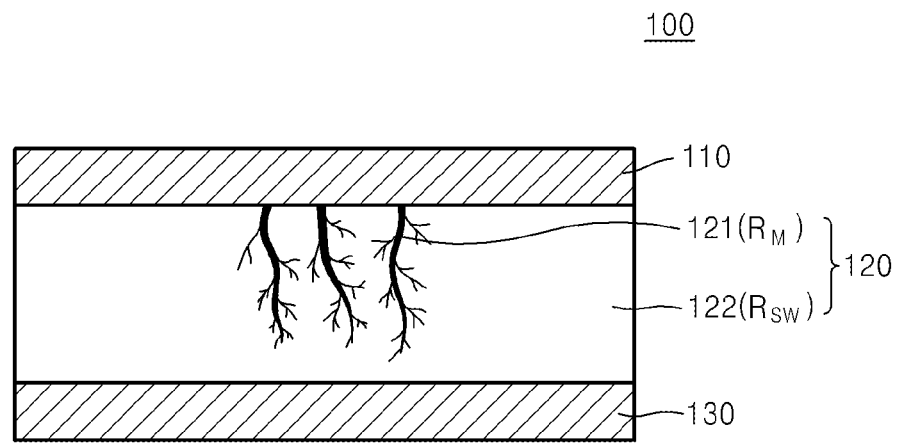
FIG. 1 is a cross-sectional view of a resistive switching device according to an example embodiment.

Various example embodiments will now be described more fully with reference to the accompanying drawings in which example embodiments are shown.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Reference will now be made in detail to embodiments, examples of which are illustrated in the accompanying drawings, wherein like reference numerals refer to like elements throughout. In the drawings, the widths and thicknesses of layers and regions may be exaggerated for clarity. In this regard, the present embodiments may have different forms and should not be construed as being limited to the descriptions set forth herein. Accordingly, the embodiments are merely described below, by referring to the figures, to explain aspects of the present description. Expressions such as "at least one of," when preceding a list of elements, modify the entire list of elements and do not modify the individual elements of the list.

FIG. 1 is a cross-sectional view of a resistive switching device 100 according to an example embodiment.

Referring to FIG. 1, the resistive switching device 100 includes a first electrode 110, a first material layer 120, and a second electrode 130. The first material layer 120 includes first and second regions 121 and 122.

While FIG. 1 shows that the resistive switching device 100 only includes components related to this example embodiment, it will be readily understood by those of ordinary skill in the art that the resistive switching device 100 may further include common elements other than those illustrated in FIG. 1.

The resistive switching device 100 switches between a low-resistance state (LRS) and a high-resistance state (HRS), and remains in the switched state of the LRS or the HRS until subsequent switching occurs. The switching of the resistive switching device 100 from the LRS to the HRS is referred to as set switching and in the reverse direction as reset switching.

The resistive switching device 100 undergoes resistive switching in response to application of a voltage. When a voltage greater than or equal to a set threshold voltage is applied to the resistive switching device 100, set switching is performed so that the resistive switching device 100 changes to the LRS. The resistive switching device 100 in the LRS retains the LRS until reset switching takes place. When a voltage greater than or equal to a reset threshold voltage is applied to the resistive switching device 100, reset switching is performed so that the resistive switching device 100 changes from LRS to the HRS.

A voltage is applied to the resistive switching device 100 through the first electrode 110. For example, the first electrode 110 may be formed of a base metal such as tungsten (W), nickel (Ni), aluminum (Al), titanium (Ti), tantalum (Ta), titanium nitride (TiN), titanium tungsten (TiW) or tantalum nitride (TaN), or conductive oxide such as indium zinc oxide (IZO) or indium tin oxide (ITO). Alternatively, the first electrode 110 may be formed of noble metals having relatively low reactivity, for example, iridium (Ir), rubidium (Ru), palladium (Pd), gold (Au), platinum (Pt), or metal oxide such as iridium oxide ($IrO_2$). Example embodiments are not limited thereto, and various other electrode materials commonly used in semiconductor devices may be used as the material of the first electrode 110.

Still referring to FIG. 1, the first material layer 120 is between the first and second electrodes 110 and 130 and composed of a transition metal oxide. For example, the first material layer 120 may be formed of at least one of Ta oxide, zirconium (Zr) oxide, yttrium (Y) oxide, yttria-stabilized zirconia (YSZ), titanium (Ti) oxide, hafnium (Hf) oxide, manganese (Mn) oxide, magnesium (Mg) oxide, and any combinations thereof. However, example embodiments are not limited thereto, and various other transition metal oxides commonly used in semiconductor devices may be used as the first material layer 120.

The first material layer 120 includes a first region 121 corresponding to a conducting path, which is created in the first material layer 120, and a second region 122 disposed in parallel with the first region 121. Thus, the first and second regions 121 and 122 have the same voltage.

When a voltage greater than or equal to a critical voltage is applied through the first electrode 110, breakdown occurs in the first material layer 120 resulting in the formation of the first region 121 corresponding to the conducting path. The first region 121 is also called a conducting filament. The electrochemical formation and rupture of the first region 121 is repeated according to a voltage applied through the first electrode 110. In accordance with the repeated formation and rupture, a resistance $R_M$ of the first region 121 changes, and the resistive switching device 100 switches to one of the LRS and the HRS. The first region 121 acts as a resistive switching element.

When a voltage greater than or equal to a first voltage is applied through the first electrode 110, the resistance $R_M$ of the first region 121 increases so that the resistive switching device 100 switches from the LRS to the HRS. In this case, the resistive switching device 100 undergoes reset switching in which the resistive status of the resistive switching device 100 switches from the HRS to the LRS. The first voltage may be a reset threshold voltage.

When a voltage applied to the first electrode 110 is greater than or equal to the first voltage, the resistance $R_M$ of the first region 121 and a voltage of the first region 121 increase as the voltage applied to the first electrode 110 increases.

In the first material layer 120, a second region 122 is disposed in parallel with the first region 121. When a voltage greater than or equal to a second voltage is applied through the first electrode 110, a resistance $R_{SW}$ of the second region 122 switches from the second resistance value to the first resistance value. The second resistance value is greater than the first resistance value. The second region 122 is also referred to as a switch element. According to at least this example embodiment, the second resistance value is greater than the resistance $R_M$ of the first region 121 of the resistive switching device 100 in the LRS, whereas the first resistance value is less than the resistance $R_M$ of the first region 121 of the resistive switching device 100 in the HRS.

Thus, when the voltage applied to the first electrode 110 is greater than or equal to the second voltage, the resistance $R_{SW}$ of the second region 122 switches from the second resistance value to the first resistance value, which is less than the resistance $R_M$ of the first region 121 of the resistance switching device in the HRS. In this case, the resistance $R_{SW}$ of the second region 122 changes from the second resistance value to the first resistance value according to a change in the amount of leakage current.

The resistance $R_M$ of the first region 121 increases as the voltage applied to the first electrode 110 increases so long as the voltage applied to the first electrode 110 does not exceed the second voltage. However, when the voltage applied to the first electrode 110 is greater than or equal to the second voltage, the resistance $R_M$ of the first region 121 is maintained constant or substantially constant despite (or independent of) an increase (or further increase) in the voltage applied to the first electrode 110. In other words, when the voltage applied to the first electrode 110 is greater than or equal to the second voltage, the resistance $R_M$ of the first region 121 remains constant or substantially constant. Furthermore, in this case, the voltage of the first region 121 ceases to increase even though the voltage applied to the first electrode 110 is increasing.

Thus, by applying the second voltage to the resistive switching device 100, the resistance $R_M$ of the first region 121 may be kept at a constant or substantially constant level after reset switching of the resistive switching device 100.

In this case, a magnitude of the second voltage is determined based on the amount of vacancies present in the second region 122. For example, a magnitude of the second voltage may decrease as the amount of vacancies present in the second region 122 increases.

Like the first electrode 110, the second electrode 130 may be formed of noble metal such as Ir, Ru, Pd, Au, or Pt, or metal oxide such as $IrO_2$. Alternatively, the second electrode 130 may be formed of base metal such as W, Ni, Al, Ti, Ta, TiN, TiW or TaN, or conductive oxide such as IZO or ITO. However, example embodiments are not limited thereto, and various other electrode materials commonly used in semiconductor devices may be used as the material of the second electrode 130. A voltage may be applied to the second electrode 130, or the second electrode 130 may be grounded.

Although the resistive switching device 100 illustrated in FIG. 1 only includes components related to this example embodiment, it may further include a buffer layer (not shown) for suppressing and/or preventing diffusion of ions, a base material layer (not shown) for supplying ions, an interlayer insulating layer (not shown), or an intermediate electrode (not shown).

Figure 2:
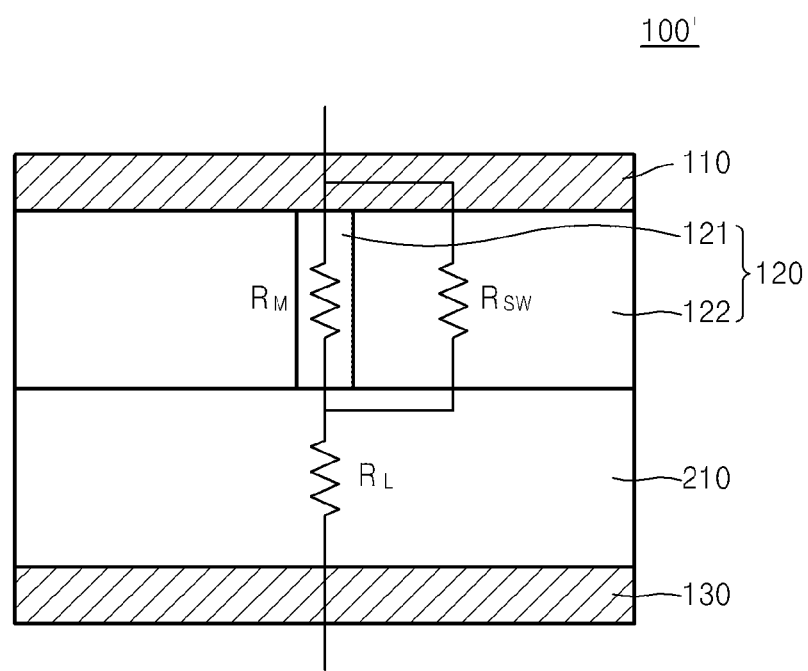
FIG. 2 is a cross-sectional view of a resistive switching device according to another example embodiment.

FIG. 2 is a cross-sectional view of a resistive switching device 100' according to another example embodiment.

Referring to FIG. 2, the resistive switching device 100' includes a first electrode 110, a first material layer 120, a second material layer 210, and a second electrode 130. The first material layer 120 includes first and second regions 121 and 122. The first and second electrodes 110 and 130 illustrated in FIG. 2 correspond to the first and second electrodes 110 and 130 illustrated in FIG. 1. Thus, since the descriptions of the first and second electrodes 110 and 130 with reference to FIG. 1 are included in the descriptions of the counterparts with reference to FIG. 2, they are not repeated.

Similar to the resistive switching device 100 of FIG. 1, upon application of a voltage, the resistive switching device 100' undergoes set switching from the LRS to the HRS and reset switching from the HRS to the LRS. A voltage is applied through the first electrode 110. Although a voltage may be applied to the second electrode 130, or the second electrode 130 may be grounded like the second electrode 130 in FIG. 1, for convenience of explanation, the second electrode 130 is assumed to be grounded.

The first material layer 120 is between the first and second electrodes 110 and 130 and is an insulating layer made of transition metal oxide. The first material layer 120 contains a relatively small amount of oxygen vacancies compared to the second material layer 210.

The second material layer 210 is a conductive layer made of transition metal oxide having a constant or substantially constant resistance $R_L$. Like the first material layer 120, the second material layer 210 is between the first and second electrodes 110 and 130. While FIG. 2 shows that the first electrode 110, the first material layer 120, the second material layer 210, and the second electrode 130 are stacked in this order, the first and second material layers 120 and 210 may be stacked in the reverse order. The second material layer 210 contains a relatively large amount of oxygen vacancies compared to the first material layer 120. In other words, the second material layer 210 has a larger amount of oxygen vacancies than the first material layer 120.

For example, the first and second material layers 120 and 210 may be formed of at least one of Ta oxide, Zr oxide, Y oxide, YSZ, Ti oxide, Hf oxide, Mn oxide, Mg oxide, and any combinations thereof. According to at least this example embodiment, transition metal oxides including the first and second material layers 120 and 210 may be $Ta_2O_5$ and $TaO_x$ (0<x<2.5), respectively, but are not limited thereto.

Before application of a voltage, the first material layer 120 only includes the second region 122 corresponding to an insulating layer having a relatively slight amount of oxygen vacancies. In this case, when a voltage greater than or equal to a critical voltage is applied to the first material layer 120 breakdown occurs, which results in formation of the first region 121 in the first material layer 120 corresponding to a conducting path due to movement of oxygen vacancies and oxygen ions. The second region 122 is the remaining portion of the first material layer 120 excluding the first region 121, and the first region 121 is located in parallel with the second region 122. Thus, the first and second regions 121 and 122 have the same voltage.

The electrochemical formation and rupture of the first region 121 is repeated according to a voltage applied through the first electrode 110. In accordance with the repeated formation and rupture, a resistance $R_M$ of the first region 121 changes, and the resistive switching device 100' repeatedly switches between the LRS and the HRS.

Although for convenience of explanation, FIG. 2 shows that the first region 121 has a polar shape, the first region 121 may be repeatedly formed and ruptured in the form of branches like the first region 121 illustrated in FIG. 1. According to at least this example embodiment, the first region 121 formed in the first material layer 120 of $Ta_2O_5$ may be $TaO_x$ (0<x<2.5).

When a voltage greater than or equal to a first voltage is applied through the first electrode 110, the resistance $R_M$ of the first region 121 increases so that the resistive switching device 100' switches from the LRS to the HRS. More specifically, the resistive switching device 100' undergoes reset switching from the HRS to the LRS. The first voltage may be a reset threshold voltage. In this case, the first region 121 is referred to as a resistive switching element.

After the reset switching, the resistance $R_M$ of the first region 121 increases as a voltage applied through the first electrode 110 increases. When a voltage applied to the first electrode 110 is greater than or equal to a second voltage, the resistance $R_M$ of the first region 121 is maintained constant or substantially constant despite (or independent of) an increase in the voltage applied to the first electrode 110. This is because when the voltage applied to the first electrode 110 is greater than or equal to the second voltage, the resistance $R_{SW}$ of the second region 122 switches from the second resistance value to the first resistance value that is less than the resistance $R_M$ of the first region 121 in the HRS. When the resistance $R_{SW}$ of the second region 122 switches from the second resistance value to the first resistance value, the amount of leakage current flowing through the second region 122 changes. Thus, the resistance $R_M$ of the first region 121 is kept at a constant or substantially constant level despite an increase in the voltage applied to the first electrode 110. In this case, the second resistance value is greater than the resistance $R_M$ of the first region 121 when the resistive switching device 100' is in the LRS. The second region 122 is also referred to as a switch element.

Furthermore, when the voltage applied to the first electrode 110 is greater than or equal to the second voltage, the voltage applied to the first region 121 ceases to increase even though the voltage applied to the first electrode 110 is increasing. Descriptions of changes in the resistance $R_M$ of the first region 121 and a voltage applied to the first region 121 will be made with reference to FIGS. 6 and 7.

The second voltage is a trigger voltage, which causes the resistance $R_{SW}$ of the second region 122 to switch from the second resistance value to the first resistance value. The trigger voltage is determined based on the amount of oxygen vacancies present within the second region 122. In this case, a magnitude of the second voltage decreases as the amount of oxygen vacancies in the second region 122 increases. The amount of oxygen vacancies may be increased to the extent that the second region 122 retains the insulating properties.

Thus, by applying the second voltage to the resistive switching device 100', the resistance $R_M$ of the first region 121 may be kept constant or substantially constant after reset switching of the resistive switching device 100'.

Furthermore, by applying a compliance current using the second material layer 210 with a constant or substantially constant resistance $R_L$, the resistance $R_M$ of the first region 121 in the LRS may be kept constant or substantially constant after set switching of the resistive switching device 100'. Thus, the resistive switching device 100' may maintain uniform or substantially uniform resistance when it is in the LRS or the HRS despite the repeated set switching and reset switching.

While the resistive switching device 100' illustrated in FIG. 2 only includes components related to this example embodiment, it will be readily understood by those of ordinary skill in the art that the resistive switching device 100' may further include a buffer layer (not shown) for suppressing and/or preventing diffusion of ions, a base material layer (not shown) for supplying ions, an interlayer insulating layer (not shown), or an intermediate electrode (not shown).

Figure 3:
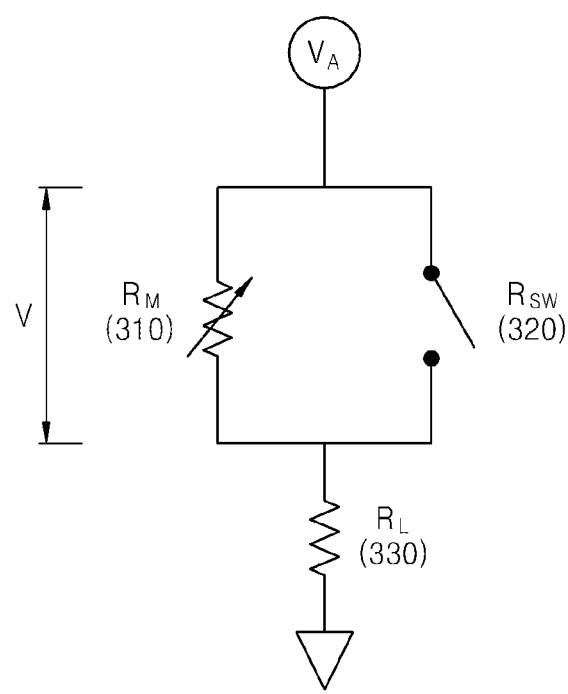
FIG. 3 is a diagram of a resistive switching device according to another example embodiment.

FIG. 3 illustrates a resistive switching device 300 according to another example embodiment.

Referring to FIG. 3, the resistive switching device 300 includes a resistive switching element 310, a switch element 320, and a resistor 330.

While the resistive switching device 300 only includes components related to this example embodiment in order to avoid obscuring aspects thereof, it will be readily understood by those of ordinary skill in the art that the resistive switching device 300 may further include various other common elements.

Like the resistive switching devices 100 and 100' in FIGS. 1 and 2, the resistive switching device 300 undergoes set switching from the LRS to the HRS and reset switching from the HRS to the LRS. Referring to FIG. 3, upon application of a voltage $V_A$, the resistive switching device 300 undergoes set switching and reset switching.

A resistance $R_M$ of the resistive switching element 310 changes due to application of the voltage $V_A$. In accordance with the change in the resistance $R_M$ of the resistive switching element 310, the resistive switching device 300 switches to one of the LRS and the HRS. The resistive switching element 310 has relatively low resistance values when it is in the LRS and relatively high resistance values when in the HRS.

In this case, when the voltage $V_A$ is greater than or equal to a first voltage, the resistance $R_M$ of the resistive switching element 310 increases so that the resistive switching device 300 switches from the LRS to the HRS. The resistive switching device 300 undergoes reset switching from the HRS to the LRS. The first voltage may be a reset threshold voltage. After this reset switching, the resistance $R_M$ of the resistive switching element 310 and a voltage V applied to the resistive switching element 310 increase as the voltage $V_A$ increases.

The switch element 320 undergoes switching according to a voltage $V_A$ applied to the resistive switching device 300, and is located in parallel with the resistive switching element 310. Thus, the resistive switching element 310 and the switch element 320 have the same voltage. When a voltage $V_A$ is greater than or equal to a second voltage, the switch element 320 undergoes switching. In this case, the switch element 320 switches resistance $R_{SW}$ according to the voltage $V_A$. For example, the switch element 320 may be implemented as a transistor, a threshold switching device, a diode, a capacitor, or the like. For convenience of explanation, it is assumed herein that the switch element 320 undergoes switching of the resistance $R_{SW}$ according to the voltage $V_A$.

When the voltage $V_A$ is greater than or equal to the second voltage, the switch element 320 switches from a second resistance value to a first resistance value. The second resistance value is greater than the first resistance value. According to at least this example embodiment, the second resistance value is greater than resistance $R_M$ of the resistive switching element 310 in the LRS while the first resistance value is less than resistance $R_M$ of the resistive switching element 310 in the HRS.

When the voltage $V_A$ is greater than or equal to the second voltage, resistance $R_{SW}$ of the switch element 320 switches from the second resistance value to the first resistance value which is less than the resistance $R_M$ of the resistive switching element 310 in the HRS.

The resistance $R_M$ of the resistive switching element 310 increases with the voltage $V_A$. However, when the voltage $V_A$ is greater than or equal to the second voltage, the resistance $R_M$ is maintained constant or substantially constant despite an increase in the voltage $V_A$. In other words, when the voltage $V_A$ is greater than or equal to the second voltage, the resistance $R_M$ of the resistive switching element 310 in the HRS is kept constant or substantially constant. Furthermore, a voltage applied to the resistive switching element 310 stops increasing even though the voltage $V_A$ is increasing.

Thus, by applying the second voltage to the resistive switching device 300, the resistance $R_M$ of the resistive switching element 310 in the HRS may be kept constant or substantially constant after reset switching of the resistive switching device 300.

The resistor 330 has a constant or substantially constant resistance value $R_L$. The resistive switching device 300 uses the resistor 330 having the constant or substantially constant resistance $R_L$ to apply a compliance current. Therefore, the resistance $R_M$ of the resistive switching element 310 in the LRS can be maintained constant or substantially constant after set switching of the resistive switching device 300.

The resistive switching device 300 according to at least this example embodiment may be realized by connecting the resistive switching element 310, the switch element 320, and the resistor 330, which are disposed separately, via lead wires or wirings. According to at least this example embodiment, the resistive switching device 300 is configured to connect a plurality of switch elements 320 to one resistive switching element 310. Alternatively, a plurality of switching element 320 may be coupled to a plurality of resistive switching elements 310.

Figure 4:
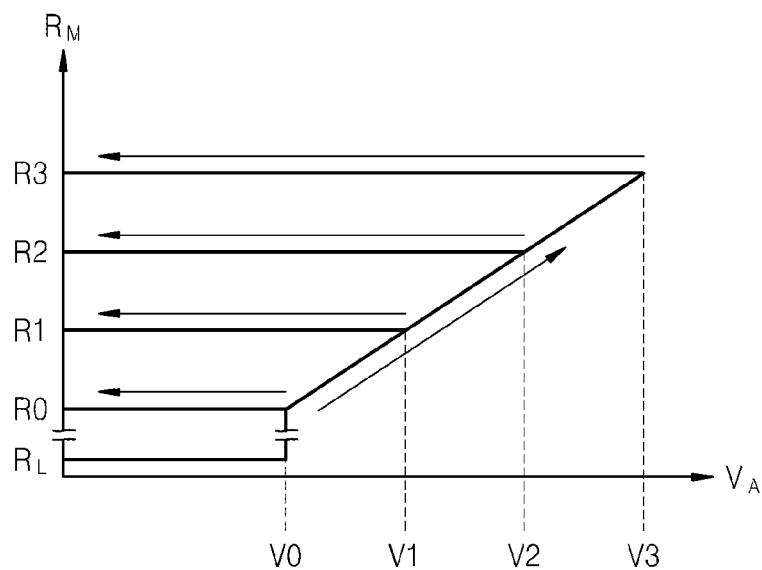
FIG. 4 is a graph illustrating an example change in resistance of a resistive switching element in a resistive switching device according to an example embodiment.

FIG. 4 is a graph illustrating an example change in resistance of a resistive switching element in a resistive switching device according to an example embodiment. The graph of FIG. 4 may also be applied to changes in the resistive switching elements (121 and 310) of the resistive switching devices 100, 100' and 300 in FIGS. 1 through 3.

Referring to FIGS. 1, 2 and 4, $V_A$ on the abscissa denotes a voltage applied to the resistive switching devices 100 and 100' through the first electrode 110, and $R_M$ on the ordinate denotes a resistance value of the first region 121 in the first material layer 120 of the resistive switching devices 100 and 100'. As described above, the first region 121 is also referred to as the resistive switching element. The first regions 121 in FIGS. 1 and 2 correspond to the resistive switching element 310 in FIG. 3. Referring to FIGS. 3 and 4, $V_A$ along the abscissa denotes the overall voltage applied to the resistive switching device 300 while $R_M$ on the ordinate denotes a resistance value of the resistive switching element 310. For convenience of explanation, a change in resistance of the resistive switching element 310 in the resistive switching device 300 will now be described. Descriptions with respect to the resistive switching device 300 may be applied in the same or substantially the same manner to the resistive switching devices 100 and 100'.

Referring to FIG. 4, when a voltage applied to the resistive switching device 300 becomes to V0, the resistance value of the resistive switching element 310 increases from resistance $R_L$ of the resistive switching device 300 in the LRS to resistance R0 of the resistive switching device 300 in the HRS. More specifically, when voltage V0 or higher is applied to the resistive switching device 300, the resistive switching device 300 undergoes reset switching from the LRS to the HRS. The voltage V0 represents a first voltage (e.g., a reset threshold voltage).

After the reset switching, when a voltage applied to the resistive switching device 300 increases from V0 to V1, V2, and to V3, the resistance value of the resistive switching element 310 increases with the increase of voltage. In other words, as the voltage applied to the resistive switching element increases, the resistance of the resistive switching element 310 increases. This is referred to as a negative differential resistance (NDR) phenomenon.

After the reset switching, the resistance value of the resistive switching element 310 increases with the increase of voltage until the applied voltage reaches a voltage V1. When the voltage ceases to be applied, the resistive switching element 310 maintains a resistance value R0. Furthermore, as long as the applied voltage is greater than V1 but does not exceed V2, the voltage increases with the increase of the voltage. When the voltage supply is interrupted, the resistive switching element 310 maintains a resistance value R1. A change in resistance of the resistive switching element 310 is applied in the same or substantially the same manner as for a voltage greater than V3. In other words, when a voltage ceases to be applied between the reset switching and subsequent set switching, the resistive switching element 310 retains a resistance value corresponding to a magnitude of the applied voltage before subsequent set switching takes place.

Due to these characteristics of the resistive switching device 300, when set switching and reset switching are repeated, a general resistive switching device may not provide uniformity in resistance values of a resistive switching element in the HRS after the reset switching. Conversely, the resistive switching device 300 according to at least this example embodiment is able to maintain uniformity or substantial uniformity of a resistance value $R_M$ of the resistive switching element 310 in the HRS after the reset switching of the resistive switching device 300 due to a change in resistance value of the switch element 320.

Figure 5:
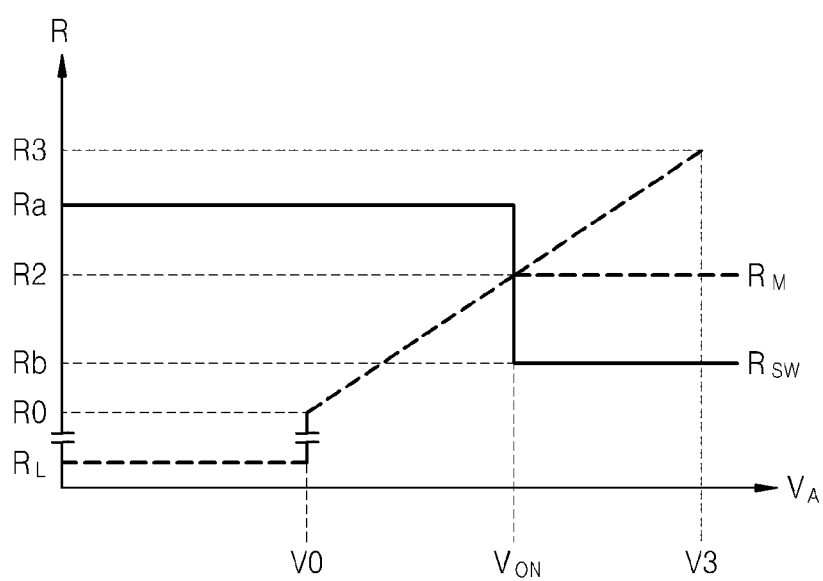
FIG. 5 is a graph illustrating an example change in resistance of a switch element in a resistive switching device according to an example embodiment.

FIG. 5 is a graph illustrating an example change in resistance of a switch element in a resistive switching device according to an example embodiment. The graph of FIG. 4 may also be applied to changes in switch elements 122 and 320 of the resistive switching devices 100, 100' and 300 in FIGS. 1 through 3.

Referring to FIGS. 1, 2 and 4, $V_A$ on the abscissa denotes a voltage applied to the resistive switching devices 100 and 100' through the first electrode 110, and $R_{SW}$ on the ordinate denotes a resistance value of the second region 122 in the first material layer 120 of the resistive switching devices 100 and 100'. As described above, the second region 122 is also referred to as the switching element. The second regions 122 in FIGS. 1 and 2 correspond to the switch element 320 in FIG. 3.

Referring to FIGS. 3 and 4, $V_A$ along the abscissa denotes the overall voltage applied to the resistive switching device 300 while $R_{SW}$ on the ordinate denotes a resistance value of the switch element 320. For convenience of explanation, a change in resistance of the switch element 320 in the resistive switching device 300 will now be described. Descriptions with respect to the resistive switching device 300 may be applied in the same or substantially the same way to the resistive switching devices 100 and 100'.

Referring to FIG. 5, a dotted line indicates a change in a resistance value $R_M$ of the resistive switching element 310 according to the applied voltage. A solid line indicates a change in a resistance value $R_{SW}$ of the switch element 320 according to the applied voltage. When a voltage applied to the resistive switching device 300 becomes V0, the resistance value $R_M$ of the resistive switching element 310 increases from resistance $R_L$ for the resistive switching device 300 in the LRS to resistance R0 for the resistive switching device 300 in the HRS. Upon applying a voltage V0 to the resistive switching device 300, the resistive switching device 300 undergoes reset switching from the LRS to the HRS. That is, in this example the voltage V0 is a first voltage or a reset threshold voltage. Before subsequent switching occurs, when a voltage applied to the resistive switching device 300 increases beyond V0, the resistance value $R_M$ of the resistive switching device 310 increases with the increase of voltage.

When a voltage $V_{ON}$ is applied to the resistive switching device 300, the resistance value $R_{SW}$ of the switch element 320 switches from a second resistance value Ra to a first resistance value Rb. That is, the voltage $V_{ON}$ represents a second voltage. Thus, even though the voltage applied to the resistive switching device 300 increases, the resistance value $R_M$ of the resistive switching element 310 is maintained constant or substantially constant. In other words, when a voltage greater than or equal to $V_{ON}$ is applied to the resistive switching device 300, the resistance value $R_{SW}$ of the switch element 320 switches from the resistance value Ra to the resistance value Rb, which is lower than the resistance value R2 of the resistive switching element 310 in the HRS of the resistive switching device 300.

As the resistance value $R_{SW}$ of the switch element 320 switches from Ra to Rb, which is lower than the resistance value R2 of the resistive switching element 310 in the HRS, the amount of current flowing through the switch element 320 changes. Due to a change in the amount of current, the resistance value $R_M$ of the resistive switching element 310 is maintained at resistance value R2 despite an increase in the applied voltage.

If the resistive switching device 300 does not include the switch element 320, the resistance value $R_M$ of the resistive switching element 310 will continue to increase to R3 with the increase of voltage. If the resistance value $R_M$ of the resistive switching element 310 continues to increase in this way, it may be relatively difficult to achieve uniformity in resistance values of the resistive switching device 300 in the HRS after the reset switching.

The resistive switching device 300 according to at least this example embodiment may maintain uniformity or substantially uniformity in the resistance value $R_M$ of the resistive switching element 310 in the HRS after reset switching due to a change in a resistance value of the switch element 320.

Figure 6:
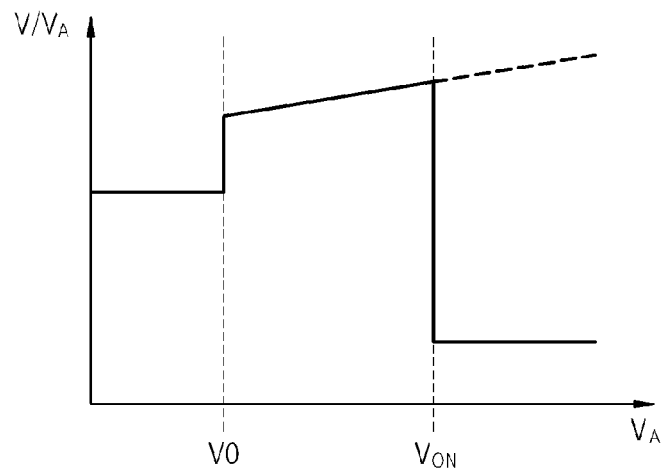
FIG. 6 is a graph illustrating an example change in voltage of a resistive switching element with respect to a voltage applied to a resistive switching device according to an example embodiment.

FIG. 6 is a graph illustrating an example change in voltage applied to a resistive switching element with respect to a voltage applied to a resistive switching device according to an example embodiment. The graph of FIG. 6 may also be applied to changes in the resistive switching elements (121 and 310) of the resistive switching devices 100, 100' and 300 in FIGS. 1 through 3.

Referring to FIGS. 1, 2 and 6, $V_A$ on the abscissa denotes a voltage applied to the resistive switching devices 100 and 100' through the first electrode 110 while $V/V_A$ on the ordinate denotes a voltage V applied to the first regions 121 divided by a voltage $V_A$ applied to the resistive switching device 300 through the first electrode 110. As described above, the first region 121 is also referred to as the resistive switching element. The first regions 121 in FIGS. 1 and 2 correspond to the resistive switching element 310 in FIG. 3.

In this case, since the first region 121 is disposed in parallel with the second region 122 in the first material layer 120, the same voltage is applied to the first and second regions 121 and 122.

Referring to FIGS. 3 and 6, $V_A$ along the abscissa denotes the overall voltage applied to the resistive switching device 300 while $V/V_A$ on the ordinate denotes a voltage V applied to the resistive switching element 310 divided by a voltage $V_A$ applied to the resistive switching device 300. In this case, since the resistive switching element 310 is disposed in parallel with the switch element 320, the same voltage is applied to the resistive switching element 310 and the switch element 320. For convenience of explanation, a change in voltage applied to the resistive switching element 310 with respect to a voltage applied to the resistive switching device 300 will now be described. Descriptions with respect to the resistive switching device 300 may be applied in the same or substantially the same way to the resistive switching devices 100 and 100'.

Referring to FIG. 6, a solid line indicates a change $V/V_A$ of a voltage V of the resistive switching element 310 with respect to a voltage $V_A$ applied to the resistive switching device 300 according to at least this example embodiment. A dotted line indicates a change $V/V_A$ of a voltage V of the resistive switching element 310 with respect to a voltage $V_A$ applied to the resistive switching device without the switch element 320.

When a voltage greater than V0 is applied to the resistive switching device 300, the resistive switching device 300 undergoes reset switching from the LRS to the HRS. That is, the voltage V0 represents a first voltage or reset threshold voltage. In this case, a resistance value of the resistive switching element 310 increases so that the resistive switching device 300 switches from the LRS to the HRS. A change $V/V_A$ of a voltage V of the resistive switching element 310, which is in the LRS before the reset switching, remains constant or substantially constant.

Before subsequent switching occurs, when a voltage V of the resistive switching device 300 increases beyond V0, the voltage V of the resistive switching element 310 also increases with the increase of voltage $V_A$ applied to the resistive switching device 300. Accordingly, the change $V/V_A$ of the voltage V of the resistive switching element 310 increases.

When a voltage $V_{ON}$ is applied to the resistive switching device 300, a resistance value of the switch element 320 switches from a second resistance value to a first resistance value. When a voltage greater than or equal to $V_{ON}$ is applied to the resistive switching device 300, a resistance value of the resistive switching element 310 is maintained constant or substantially constant even though a voltage applied to the resistive switching device 300 increases beyond $V_{ON}$. In this case, the voltage $V_{ON}$ denotes a second voltage. The voltage V of the resistive switching element 310 stops increasing despite an increase in voltage applied to the resistive switching device 300. In other words, as apparent from the graph of FIG. 6, the voltage change $V/V_A$ is kept constant or substantially constant.

If the resistive switching device does not include the switch element 320, a voltage V of the resistive switching element 310 continues to increase as indicated by the dotted line in FIG. 6. As apparent from the graph, when the voltage V continues to increase, it may be relatively difficult to achieve uniformity in resistance values of the resistive switching device in the HRS after the reset switching.

Figure 7:
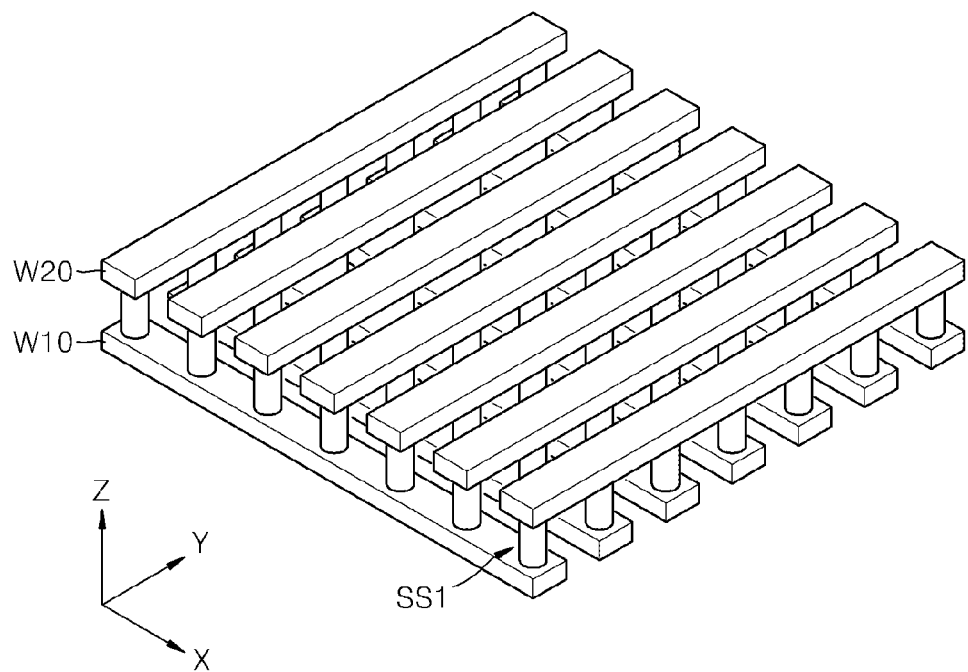
FIG. 7 illustrates a memory device using a resistive switching device according to an example embodiment.

FIG. 7 illustrates a memory device 700 employing a resistive switching device according to an example embodiment.

Referring to FIG. 7, the memory device 700 may include a resistive switching element 100, 100', or 300. Thus, while not described below, the above descriptions of the resistive switching devices 100, 100', and 300 with reference to FIGS. 1 through 3 are also included in the description of the memory device 700 illustrated in FIG. 7.

The memory device 700 illustrated in FIG. 7 only includes components related to this example embodiment in order to avoid obscuring aspects thereof. Thus, it will be readily understood by those of ordinary skill in the art that the memory device 700 may further include various common elements other than the components illustrated in FIG. 7.

The memory device 700 is a nonvolatile memory configured to retain data written to the memory even after voltage supply is interrupted. Referring to FIG. 7, the memory device 700 includes a plurality of memory cells SS1 to or from which data is written or deleted as the resistive switching element switches to one of the HRS and the LRS.

Each of the memory cells SS1 includes a resistive switching element 100, 100', or 300 having the structure described above with reference to FIGS. 1 through 3. For convenience of explanation, the memory device 700 is hereinafter assumed to include the memory cells using the resistive switching device 100' of FIG. 2.

The memory device 700 according to at least this example embodiment is a crossbar point RRAM array.

Referring to FIG. 7, the memory device 700 has a crossbar point array structure. More specifically, the memory device 700 includes a plurality of first wirings W10 arranged parallel or substantially parallel to each other in a first direction (e.g., an X-axis direction), a plurality of second wirings W20 arranged parallel or substantially parallel to each other in a direction (e.g., a Y-axis direction) so as to cross the first wirings W10, and a plurality of memory cells SS1 arranged at at least some of the cross-points between the first and second wirings W10 and W20. The first and second wirings W10 and W20 correspond to the first and second electrodes 110 and 130 of FIG. 1 or FIG. 2.

Each of the plurality of memory cells SS1 may include the first and second material layers 120 and 210 on a corresponding one of the first wirings W10 so that the memory cell SS1 is disposed at a cross-point of the first and second wirings W10 and W20. The first material layer 120 may include the first region 121, which is a resistive switching element, and a second region 122.

Upon applying a voltage to one memory cell SS1 through the first and second wirings W10 and W20 for operation, data is written to or deleted from the memory cell.

The first material layer 120 may be an insulator layer made of transition metal oxide. The second material layer 210 is a conducting layer made of transition metal oxide. The transition metal oxide in the first or second material layer 120 or 210 may be at least one of Ta oxide, Zr oxide, Y oxide, YSZ, Ti oxide, Hf oxide, Mn oxide, Mg oxide, and any combinations thereof. The first material layer 120 has a relatively slight amount of oxygen vacancies while the second material layer 210 contains a relatively large amount of oxygen vacancies. For example, the transition metal oxides in the first and second material layers 120 and 210 may be $Ta_2O_5$ and $TaO_x$ ($0<x<2.5$), respectively.

The first region 121 corresponds to a conducting path formed in the first material layer 120. When a voltage applied to a memory cell SS1 is greater than or equal to a first voltage, a resistance value of the first region 121 increases so that the memory cell SS1 is switched from an on state to an off state.

In the first material layer 120, the second region 122 is located in parallel with the first region 121. When a voltage applied to the memory cell SS1 is greater than or equal to a second voltage, a resistance value of the second region 122 switches to a first resistance value that is lower than a resistance value of the first region 121 in an off state. Thus, due to the switching of resistance value of the second region 122, the resistance value of the first region 121 is maintained constant or substantially constant.

Since the structure and operation of the first region 121 that is a resistive switching element and the second region 122 that is a switch element are similar or substantially similar to those of the counterparts described with reference to FIG. 2, repeated descriptions are omitted herein.

Although not shown, the memory cell SS1 may further include a buffer layer, a base material layer, and an interlayer insulating layer, which are disposed between the first and second wirings W10 and W20.

While the memory cell SS1 has a cylindrical stacked structure, it is not limited thereto, and may have various other shapes such as square prism or a pillar shape becoming wider towards the bottom.

The memory device 700 according to at least this example embodiment may have a plurality of stacked structures by repeating a memory cell stack structure, each stacked structure including wirings and memory cells SS1.

When a critical voltage is applied to one memory cell SS1 through the first and second wirings W10 and W20, oxygen vacancies and oxygen ions may move in the memory cell SS1, resulting in formation of the first region 121 corresponding to the conducting path in the first material layer 120.

When a set voltage is applied to one memory cell SS1 through the first and second wirings W10 and W20, a resistance value of the first region 121, which is the resistive switching element, decreases, and the memory cell SS1 is switched from an off state to an on state. In this case, it is assumed that one bit of data (e.g., "0" or "1") is written to the memory cell SS1.

While example embodiments have been particularly shown and described, the example embodiments described therein should be considered in a descriptive sense only and not for purposes of limitation. It will be readily understood by those of ordinary skill in the art that variations in the structure of memory devices according to example embodiments may be made therein. For example, each of the plurality of memory cells SS1 may have a multi-layer structure. The resistive switching devices 100, 100' and 300 in FIGS. 1 through 3 may also be employed in crossbar point array memory devices and other various memory devices. Example embodiments may be applied to RRAMs as well as other types of memory devices.

As described above, a switch element is connected in parallel to a resistive switching element whose resistance varies according to an applied voltage so that the resistance of the resistive switching element in a high resistance state is kept constant or substantially constant after reset switching of a resistive switching device. Thus, the resistive switching device may maintain resistance uniformity when it is in a high resistance state despite the repeated set an reset switching operations.

As described above, resistive switching devices according to at least some example embodiments are employed in semiconductor devices such as nonvolatile memory devices. The resistive switching devices according to example embodiments may also be used in a logic gate for realizing a logic circuit. Furthermore, resistive switching devices according to example embodiments may apply to a memristor. The operation of the memristor may be implemented similarly or substantially similarly to the operation of semiconductor devices according to example embodiments. The memristor is a device that remembers the direction and amount of current that has passed through it and in which resistance changes according to the direction and amount of current.

The scope of this application is defined not by the detailed description of the invention but by the appended claims. Descriptions of features or aspects within each example embodiment should typically be considered as available for other similar features or aspects in other embodiments.

What is claimed is:

1. A resistive switching device comprising:
   a first material layer between a first electrode and a second electrode, the first material layer including a first region and a second region, the first region and the second being electrically connected in parallel between the first electrode and the second electrode; wherein
   the first region corresponds to a conducting path formed in the first material layer,
   the first region is configured to switch from a low-resistance state to a high-resistance state in response to an applied voltage that is greater than or equal to a first voltage,
   the second region is configured to switch to a first resistance value that is less than a resistance value of the first region in the high-resistance state when the applied voltage is greater than or equal to a second voltage, and
   the resistance value of the first region remains constant or substantially constant, even as the applied voltage increases, by switching to the first resistance value of the second region.

2. The device of claim 1, wherein when the applied voltage is greater than or equal to the first voltage, the resistance value of the first region increases with the increase of the applied voltage, but when the applied voltage is greater than or equal to the second voltage, the resistance value of the first region is constant or substantially constant even as the applied voltage increases.

3. The device of claim 1, wherein when the applied voltage is greater than or equal to the first voltage, a voltage of the first region increases as the applied voltage increases, but when the applied voltage is greater than or equal to the second voltage, the voltage of the first region ceases to increase even as the applied voltage increases.

4. The device of claim 1, wherein when the applied voltage is greater than or equal to the second voltage, an amount of leakage current flowing through the second region changes, and a resistance value of the second region switches from a second resistance value, which is greater than the resistance value of the first region in the low-resistance state, to the first resistance value according to the change in the amount of the leakage current.

5. The device of claim 1, wherein the second voltage is determined based on an amount of vacancies present in the second region.

6. The device of claim 5, wherein a magnitude of the second voltage decreases as the amount of vacancies in the second region increases.

7. The device of claim 1, further comprising:
   a second material layer having a constant or substantially constant resistance value; wherein
      an amount of vacancies in the second region is less than an amount of vacancies in the second material layer.

8. The device of claim 1, further comprising:
   a second material layer; wherein
      the first material layer is an insulating layer including a first transition metal oxide, and the second material layer is a conducting layer including a second transition metal oxide, and
      an amount of oxygen vacancies in the second region is less than an amount of oxygen vacancies in the second material layer.

9. The device of claim 8, wherein the first and second transition metal oxides include at least one of tantalum (Ta) oxide, zirconium (Zr) oxide, yttrium (Y) oxide, yttria-stabilized zirconia (YSZ), titanium (Ti) oxide, hafnium (Hf) oxide, manganese (Mn) oxide, magnesium (Mg) oxide, and any combinations thereof.

10. The device of claim 8, wherein the first transition metal oxide included in the second region of the first material layer is $Ta_2O_5$, and wherein the second transition metal oxide is $TaO_x$ ($0<x<2.5$).

11. A resistive switching device comprising:
    a material layer including,
       a resistive switching element configured to switch between a low-resistance state and a high-resistance state in response to an applied voltage that is greater than or equal to a first voltage; and
       a switch element electrically connected in parallel with the resistive switching element, the switch element being configured to switch from a second resistance value to a first resistance value when the applied voltage is greater than or equal to a second voltage, the first resistance value being less than a resistance value of the resistive switching element in the high-resistance state; wherein
          the resistance value of the resistive switching element remains constant or substantially constant, even as the applied voltage increases, by switching to the first resistance value of the second region.

12. The device of claim 11, wherein when the applied voltage is greater than or equal to the first voltage, the resistance value of the resistive switching device and a voltage of the resistive switching device increase as the applied voltage increases, and wherein when the applied voltage is greater than or equal to the second voltage, the resistance value of the resistive switching device remains constant or substantially constant and the voltage of the resistive switching device ceases to increase even as the applied voltage increases.

13. The device of claim 11, wherein the second resistance value is greater than the resistance value of the resistive switching element in the low-resistance state.

14. The device of claim 11, wherein one or a plurality of resistive switching elements are connected to one or a plurality of switch elements.

15. A memory cell comprising:
   the resistive switching device of claim 1 configured to at least one of write and delete data to and from the memory cell by switching between the high-resistance state and the low-resistance state.

16. A memory device comprising:
   at least one first wiring;
   at least one second wiring crossing the at least one first wiring; and
   at least one memory cell at a cross point between the first and second wirings;
   wherein the memory cell includes,
      a first material layer between a first electrode and a second electrode, the first material layer including a first region and a second region, the first region and the second region being electrically connected in parallel between the first electrode and the second electrode; wherein
         the first region corresponds to a conducting path formed in the first material layer,
         the first region is configured to switch from a low-resistance state to a high-resistance state in response to an applied voltage that is greater than or equal to a first voltage,
         the second region is configured to switch to a first resistance value that is less than a resistance value of the first region in the high-resistance state when the applied voltage is greater than or equal to a second voltage, and
         the resistance value of the first region remains constant or substantially constant, even as the applied voltage increases, by switching to the first resistance value of the second region.

17. The device of claim 16, wherein when the applied voltage is greater than or equal to the first voltage, the resistance value of the memory cell and the voltage of the memory cell increase with the increase of the applied voltage, and wherein when the applied voltage is greater than or equal to the second voltage, the resistance value of the memory cell remains constant or substantially constant and the voltage of the memory cell stops increasing even as the applied voltage increases.

18. The device of claim 16, wherein when the applied voltage is greater than or equal to the second voltage, the amount of leakage current flowing through the second region changes, and a resistance value of the second region switches from a second resistance value, which is greater than the resistance value of the first region in an on state, to the first resistance value according to the change in the amount of the leakage current.

19. The device of claim 16, further comprising:
   a second material layer, the second material layer being a conductive layer including a transition metal oxide; wherein
      an amount of oxygen vacancies in the second region is less than an amount of oxygen vacancies in the second material layer, and
      a magnitude of the second voltage is determined based on the amount of oxygen vacancies in the second region.

20. The device of claim 19, wherein the second region of the first material layer is $Ta_2O_5$, and the transition metal oxide of the second material layer is $TaO_x$ ($0<x<2.5$).

* * * * *